United States Patent
Racanelli

(10) Patent No.: US 7,217,613 B2
(45) Date of Patent: May 15, 2007

(54) LOW COST FABRICATION OF HIGH RESISTIVITY RESISTORS

(75) Inventor: Marco Racanelli, Santa Ana, CA (US)

(73) Assignee: Newport Fab, LLC, Newport Beach, CA (US)

( * ) Notice: Subject to any disclaimer, the term of this patent is extended or adjusted under 35 U.S.C. 154(b) by 199 days.

(21) Appl. No.: 09/833,953

(22) Filed: Apr. 11, 2001

(65) Prior Publication Data

US 2002/0151148 A1 Oct. 17, 2002

(51) Int. Cl.
*H01L 21/8234* (2006.01)

(52) U.S. Cl. .............. 438/238; 438/190; 438/210; 438/385; 257/E27.016; 257/E27.03; 257/E27.033; 257/E27.045

(58) Field of Classification Search .......... 438/171, 438/172, 185, 197, 202, 210, 231, 232, 235, 438/238, 296, 301, 306, 307, 312, 314, 313, 438/330, 331, 332, 369, 382, 383, 385, 328, 438/190; 257/E21.016, E27.03, E27.033, 257/E27.045

See application file for complete search history.

(56) References Cited

U.S. PATENT DOCUMENTS

| | | | | | |
|---|---|---|---|---|---|
| 5,436,177 | A | * | 7/1995 | Zaccherini | ............... 438/385 |
| 5,489,547 | A | * | 2/1996 | Erdeljac et al. | ............ 438/238 |
| 6,156,602 | A | * | 12/2000 | Shao et al. | ................ 438/238 |
| 6,165,861 | A | * | 12/2000 | Liu et al. | ..................... 438/382 |

* cited by examiner

*Primary Examiner*—Matthew Smith
*Assistant Examiner*—Julio J. Maldonado
(74) *Attorney, Agent, or Firm*—Farjami & Farjami LLP

(57) ABSTRACT

In one disclosed embodiment a layer is formed over a transistor gate and a field oxide region. For example, a polycrystalline silicon layer can be deposited over a PFET gate oxide and a silicon dioxide isolation region on the same chip. The layer is then doped over the transistor gate without doping the layer over the field oxide. A photoresist layer can be used as a barrier to implant doping, for example, to block N+ doping over the field oxide region. The entire layer is then doped, for example, with P type dopant after removal of the doping barrier. The second doping results in formation of a high resistivity resistor over the field oxide region, without affecting the transistor gate. Contact regions are then formed of a silicide, for example, for connecting the resistor to other devices.

11 Claims, 3 Drawing Sheets

LOW COST FABRICATION OF HIGH RESISTIVITY RESISTORS

BACKGROUND OF THE INVENTION

1. Field of the Invention

The present invention relates to the field of fabrication of semiconductor devices. More specifically, the invention relates to the fabrication of CMOS, BiCMOS, or silicon-germanium BiCMOS semiconductor devices.

2. Related Art

In the manufacture of large scale integration semiconductor devices, several types of devices are fabricated concurrently on the same chip or wafer. For example, in a complementary metal oxide semiconductor ("CMOS") process both P-channel field effect transistors ("PFET") and N-channel field effect transistors ("NFET") are manufactured on the same chip concurrently. A bipolar complementary metal oxide semiconductor ("BiCMOS") process increases the complexity by adding the concurrent fabrication of bipolar devices—for example, conventional NPN or PNP transistors—to the same chip. By growing a thin silicon-germanium layer as the base of a bipolar transistor on a silicon wafer, a heterojunction bipolar transistor ("HBT") with improved speed and frequency response can be formed. The addition of silicon-germanium techniques to the BiCMOS process, for example, is referred to as silicon-germanium BiCMOS. In order to form circuits on a chip, various other circuit components such as resistors and capacitors are also formed concurrently on a chip. Using CMOS for an example, resistors are formed concurrently with PFETs and NFETs.

Because devices are formed concurrently on the same chip a process step used in the fabrication of one device may affect the fabrication of other devices. Occasionally extra process steps must be added in order to keep processes required for fabrication of one device from conflicting with the fabrication process of another device on the same chip. Therefore, it is advantageous and desirable to simplify the fabrication process whenever possible by, for example, eliminating steps or finding compatible processes. Simplification of the fabrication process can also provide economic benefits by making the manufacturing process either cheaper or more efficient. As an example, on a CMOS, BiCMOS, or silicon-germanium BiCMOS chip, resistors are typically formed in the same polycrystalline silicon layer used to form the gates of PFETs and NFETs on the same chip.

The value of a resistor is measured in ohms. As known in the art, the value of a resistor is directly proportional to the resistivity of the material comprising the resistor multiplied by the length of the resistor and inversely proportional to the product of the width and depth of the resistor. The resistivity of a material can also be measured by its sheet resistance expressed in ohms per square (because a small square has the same resistance as a larger square of the same thickness). The value of the resistor is then determined by the number of squares comprising the resistor, calculated by dividing the length by the width. On a semiconductor chip, the resistivity of the material comprising the resistor can be readily manipulated by changing the doping of the material.

By way of background, FIG. 1 shows a cross sectional view of various features and components of structure 100 which includes various features and components of a low resistivity resistor and a PFET fabricated on the same wafer. Structure 100 includes polycrystalline silicon layer 102 for a low resistivity resistor. Polycrystalline silicon layer 102 is N+ doped—meaning that it is relatively heavily N type doped. Polycrystalline silicon layer 102 can be doped by implantation or diffusion as known in the art. Polycrystalline silicon layer 102 is typically phosphorous doped with a dose of approximately $5*10^{15}$ atoms per square centimeter. The thickness of polycrystalline silicon layer 102 is typically approximately 2,500 Angstroms.

Polycrystalline silicon layer 102 is used to form a resistor by providing silicide contact regions 104 at the ends of polycrystalline silicon layer 102 as shown in FIG. 1. Silicide contact regions 104 provide a means for connecting the resistor formed from polycrystalline silicon layer 102 to other devices on the wafer or to external electrical contacts. Formation of silicide over the entire length of polycrystalline silicon layer 102 is prevented by silicide blocking oxide 106. Silicide blocking oxide 106 is formed before silicide contact regions 104 and can be formed from silicon oxide ($SiO_2$) as known in the art. Polycrystalline silicon layer 102 is formed on field oxide 108. Field oxide 108, 110, and 112 structures are composed of silicon oxide material and are formed in a manner known in the art. Field oxide 108, 110, and 112 provide electrical isolation between devices on silicon substrate 116 in a manner known in the art.

Continuing with structure 100 in FIG. 1, structure 100 includes features and components of other CMOS structures, such as a P-channel field effect transistor, or PFET, on the same wafer as a resistor. Structure 100 includes N well 118 for a PFET. N well 118 is N type single crystal silicon which can be doped by ion implantation in a manner known in the art. Structure 100 further includes source 120 and drain 122 composed of P+ type material—meaning that it is relatively heavily doped P type material —which can be doped in a manner known in the art. Structure 100 also includes gate oxide 124, and gate polycrystalline silicon 126, both formed in a manner known in the art. By the addition of N well 118, source 120, drain 122, gate oxide 124, and gate polycrystalline silicon 126, a PFET is formed on the same wafer as a resistor.

Gate polycrystalline silicon 126 is formed from the same layer as polycrystalline silicon layer 102 and both are doped at the same time. Thus, gate polycrystalline silicon 126 is typically N+doped using phosphorous dopant with a dose of approximately $5*10^{15}$ atoms per square centimeter and the thickness of gate polycrystalline silicon 126 is typically approximately 2,500 Angstroms. The doping of gate polycrystalline silicon 126 determines the doping of polycrystalline silicon layer 102. That is, considerations determinative of a desirable value for gate resistivity of approximately 100 ohms per square take precedence over considerations for resistor resistivity. Thus, the value of the resistor is adjusted by adjusting the number of squares in the resistor rather than adjusting the resistivity of the material comprising the resistor.

In summary, FIG. 1 shows that structure 100 includes several features and components used to form a resistor on field oxide 108, while structure 100 simultaneously includes several CMOS features and components such as the PFET between field oxide 110 and field oxide 112. Thus, during the process of fabricating a resistor, several of the features and components for CMOS structures, such as N well 118, source 120, drain 122, gate oxide 124, and gate polycrystalline silicon 126 are present on the same wafer. Hence, the processing steps for forming a resistor are required to be economical and compatible with CMOS processes, i.e. not conflict with or cause undesirable changes in other CMOS structures on the same wafer. Adjustment of constraints and parameters, in particular the resistivity, involved in resistor formation is, therefore, subjugated to the requirements of PFET (or NFET) formation when a resistor is fabricated as illustrated in FIG. 1.

The resistor illustrated in FIG. 1 has a relatively low resistivity of approximately 100 ohms per square, as pointed out above. There are certain advantages to fabricating a resistor with a higher resistivity, for example, temperature coefficient of the resistor, also referred to as "TCR", can be improved. Simply stated, TCR expresses the change in resistance per degree C. from the resistance value at 25° C. For example, a 1,000 ohm resistor with a TCR of 0.1%/° C. has a value of 1050 ohms at 75° C. A smaller TCR improves the thermal stability of the circuit, i.e. circuit performance is more predictable and dependable despite temperature changes. As another example, reduced variability in resistivity for higher resistivity values can be used to improve the accuracy in fabrication of the resistor value.

Thus, there is need in the art to provide economical and simplified formation of high resistivity resistors in large scale integrated CMOS processes which are compatible with the formation of polycrystalline silicon gates in PFETs and NFETs. Moreover, there is need in the art for fabrication of high resistivity resistors with improved temperature coefficient and more accurate control of resistivity value.

SUMMARY OF THE INVENTION

The present invention is directed to low cost fabrication of high resistivity resistors. The invention provides an economical and simplified method for formation of high resistivity resistors in large scale integrated CMOS processes which is compatible with the formation of polycrystalline silicon gates in PFETs and NFETs. The invention reduces cost by providing a resistor fabrication process which does not rely on the use of multiple doping barriers to form the implant doped portion of a high resistivity resistor. Moreover, fabrication of high resistivity resistors with improved temperature coefficient and more accurate control of resistivity value is facilitated.

According to the invention a layer is formed over a transistor gate and a field oxide region. For example, a polycrystalline silicon layer can be deposited over a PFET gate oxide and a silicon dioxide isolation region on the same chip. The layer is then doped over the transistor gate without doping the layer over the field oxide. A photoresist layer can be used as a barrier to implant doping, for example, to block N+ doping over the field oxide region. The entire layer is then doped, for example, with P type dopant after removal of the doping barrier. The second doping results in formation of a high resistivity resistor over the field oxide region, without affecting the transistor gate. Contact regions are then formed of an appropriate material, for example a silicide, for connecting the resistor to other devices.

DETAILED DESCRIPTION OF THE INVENTION

The present invention is directed to low cost fabrication of high resistivity resistors. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
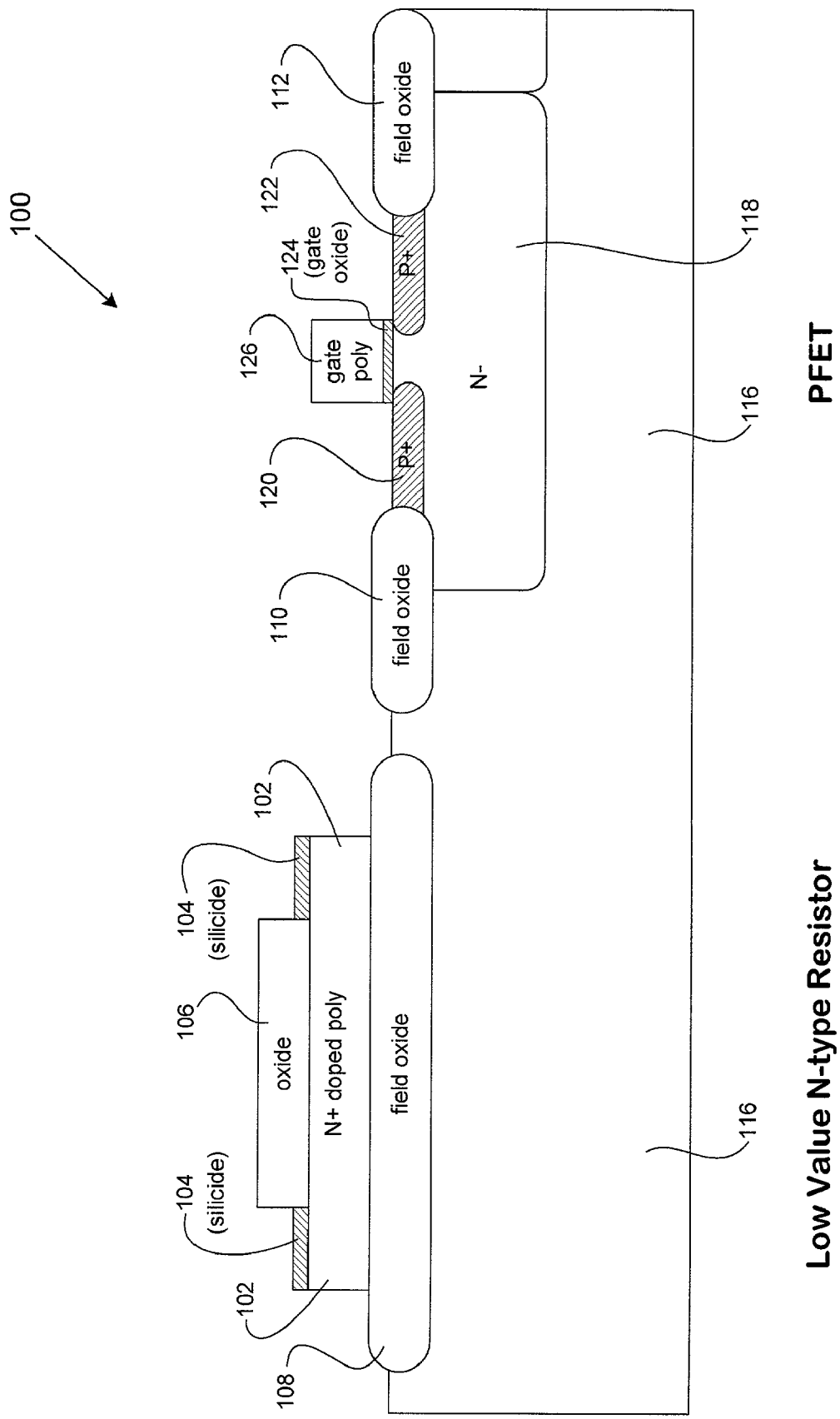
FIG. 1 illustrates a cross sectional view of some of the features of a resistor and a PFET fabricated on the same wafer.
Figure 2:
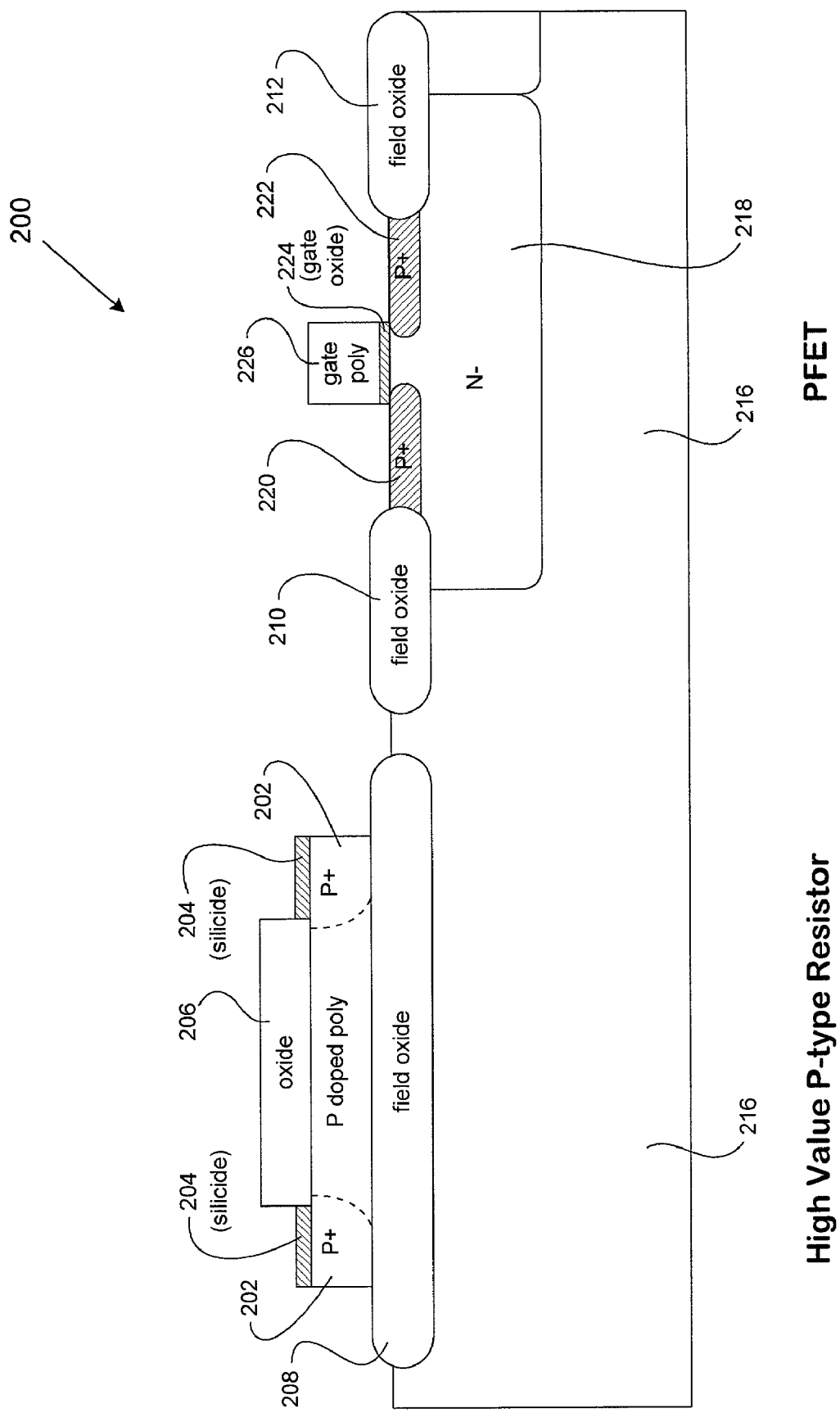
FIG. 2 illustrates a cross sectional view, similar to that of FIG. 1, of some of the features of a resistor fabricated on the same wafer with a PFET in accordance with one embodiment of the present invention.

Referring now to FIG. 2, a cross sectional view, similar to that of FIG. 1, of various features and components of structure 200 is used to illustrate some of the features of a resistor fabricated on the same wafer with a PFET in accordance with one embodiment of the present invention. Structure 200 of FIG. 2 shows various features and components which correspond to those of structure 100 of FIG. 1. Features and components of structure 200 corresponding to those of structure 100 are numbered in a manner consistent with FIG. 1. In particular, polycrystalline silicon layer 102 and gate polycrystalline silicon 126 correspond, respectively, to polycrystalline silicon layer 202 and gate polycrystalline silicon 226. In addition, silicide contact regions 104, silicide blocking oxide 106, field oxide 108, 110, and 112, substrate 116, N well 118, source 120, drain 122, and gate oxide 124 are shown, respectively, as silicide contact regions 204, silicide blocking oxide 206, field oxide 208, 210, and 212, substrate 216, N well 218, source 220, drain 222, and gate oxide 224.

Structure 200 includes polycrystalline silicon layer 202 for a high resistivity resistor. Polycrystalline silicon layer 202 is deposited on the chip and P type doped. According to one embodiment polycrystalline silicon layer 202 is doped by ion implantation. Polycrystalline silicon layer 202 can be boron doped, for example, with a dose of approximately $1*10^{15}$ atoms per square centimeter. The thickness of polycrystalline silicon layer 202, according to one embodiment, is approximately 2,500 Angstroms.

Polycrystalline silicon layer 202 is used to form a resistor by fabricating silicide contact regions 204 at the ends of polycrystalline silicon layer 202 as shown in FIG. 2. Silicide contact regions 204 provide a means for electrically connecting the resistor formed from polycrystalline silicon layer 202 to other devices on the wafer or to external electrical contacts. Formation of silicide over the entire length of polycrystalline silicon layer 202 is prevented by silicide blocking oxide 206. Silicide blocking oxide 206 is formed before silicide contact regions 204 and can be formed from silicon oxide ($SiO_2$) as known in the art. Moreover, polycrystalline silicon layer 202 can be P+ doped—meaning that it is relatively heavily P type doped—after the formation of silicide blocking oxide 206 and before the formation of silicide contact regions 204, to form P+ doped regions in polycrystalline silicon layer 202 below silicide contact regions 204, as shown in FIG. 2. The P+ doped regions in polycrystalline silicon layer 202 can be used to improve the electrical connectivity of silicide contact regions 204.

Polycrystalline silicon layer 202 is formed over field oxide 208. Field oxide 208, 210, and 212 are composed of silicon dioxide ($SiO_2$) material and are formed in a manner known in the art. Field oxide 208, 210, and 212 provide electrical isolation between devices on silicon substrate 216 in a manner known in the art.

Continuing with structure 200 in FIG. 2, structure 200 includes features and components of other CMOS structures, such as a P-channel field effect transistor, or PFET. Structure 200 includes N well 218 for a PFET. N well 218 is N type single crystal silicon which can be doped by ion implantation in a manner known in the art. Structure 200 further includes source 220 and drain 222 composed of P+ type material. Structure 200 also includes gate oxide 224 formed in a manner known in the art. Gate polycrystalline silicon 226 is formed above gate oxide 224, as shown in FIG. 2. According to one embodiment, the thickness of gate polycrystalline silicon 226 is approximately 2,500 Angstroms. By the addition of N well 218, source 220, drain 222, gate oxide 224, and gate polycrystalline silicon 226, a PFET is formed on the same wafer as the resistor comprising polycrystalline silicon layer 202.

Gate polycrystalline silicon 226 is formed over the transistor gate from the same layer as polycrystalline silicon layer 202. Gate polycrystalline silicon 226 is also referred to as the "gate region" of the layer used to form polycrystalline silicon layer 202 and gate polycrystalline silicon 226. According to one embodiment, gate polycrystalline silicon 226 is N+ doped using phosphorous dopant with a dose of approximately $6.5*10^{15}$ atoms per square centimeter. The N+ doping is performed while a doping barrier blocks the N+ doping from the resistor region of polycrystalline silicon layer 202. The relatively high N+ dose of approximately $6.5*10^{15}$ phosphorous atoms per square centimeter allows gate polycrystalline silicon 226 to be subsequently P type doped along with the resistor comprising polycrystalline silicon layer 202 without affecting the electrical properties of gate polycrystalline silicon 226. In other words the performance of the PFET comprising N well 218, source 220, drain 222, gate oxide 224, and gate polycrystalline silicon 226 is unaffected by the process used to form the resistor comprising polycrystalline silicon layer 202.

Thus, the resistor comprising polycrystalline silicon layer 202 is formed without the need to provide a second doping barrier to block the P type doping from gate polycrystalline silicon 226. Elimination of a second doping barrier from the process used to form the resistor comprising polycrystalline silicon layer 202 simplifies the process and makes the process more economical. Moreover, the value of the resistor can be adjusted by adjusting both the number of squares in the resistor and adjusting the resistivity of the material comprising the resistor.

In summary, FIG. 2 shows that structure 200 includes several features and components used to form a high resistivity resistor on field oxide 208, while structure 200 simultaneously includes several CMOS features and components such as the PFET between field oxide 210 and field oxide 212. Thus, during the process of fabricating a resistor, several of the features and components for CMOS structures, such as N well 218, source 220, drain 222, gate oxide 224, and gate polycrystalline silicon 226 are present on the same wafer. Thus, a high resistivity resistor is formed on the same chip with other CMOS devices using processing steps which are economical and compatible with CMOS processes, i.e. which do not conflict with or cause undesirable changes in other CMOS structures on the same wafer. Moreover, adjustment of the resistivity of the resistor is not subjugated to the requirements of PFET (or NFET) formation, that is, the doping of the resistor is independent of the doping of the PFET gate.

Figure 3:
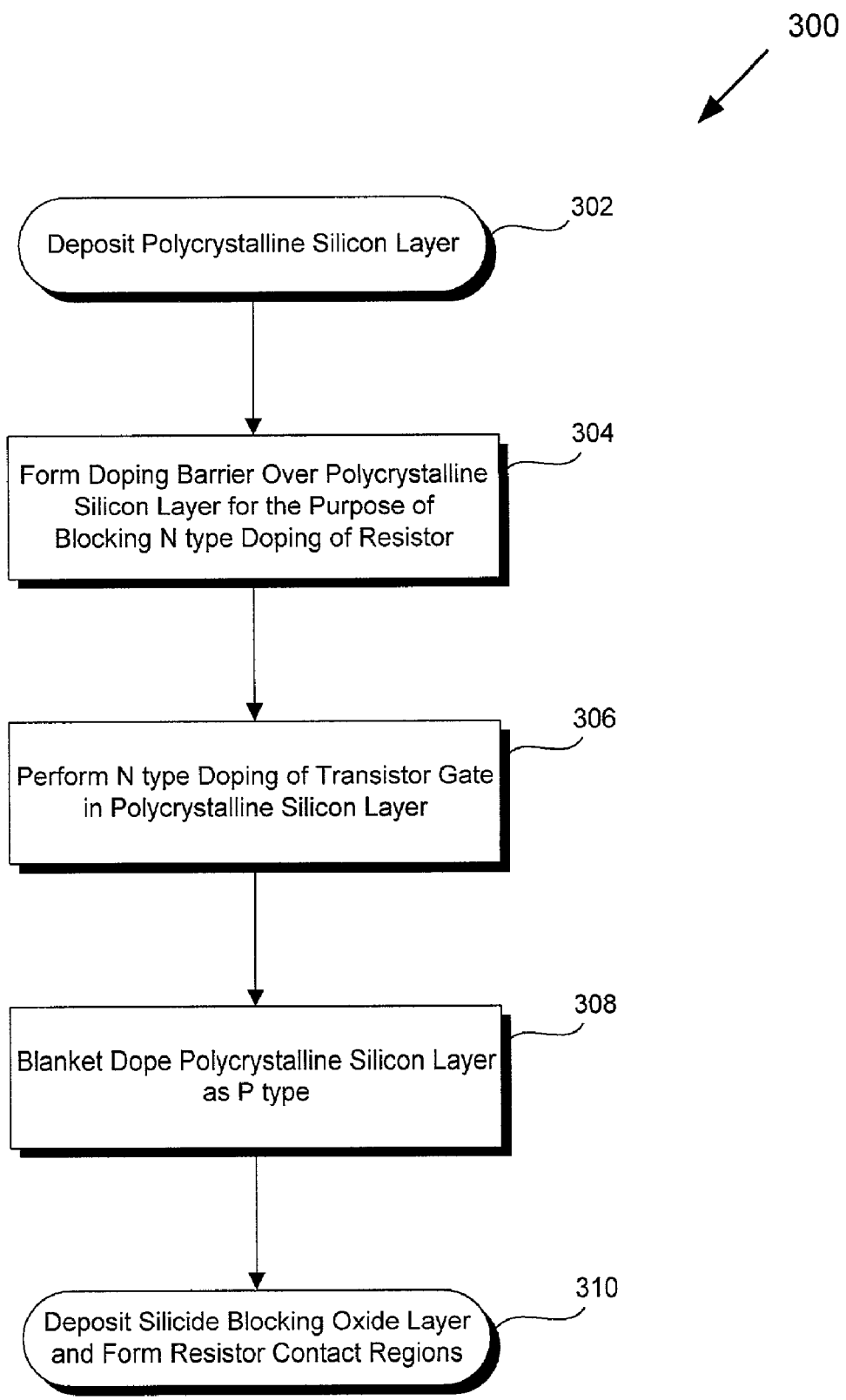
FIG. 3 is a flowchart describing process steps used to implement one embodiment of the present invention.

FIG. 3 shows flowchart 300 which describes the steps in processing a wafer in accordance with one embodiment to form the resistor of structure 200. Certain details and features have been left out of flowchart 300 which are apparent to a person of ordinary skill in the art, for example, a step may consist of one or more substeps or may involve specialized equipment, as known in the art. Steps 302 through 310 indicated in flowchart 300 are sufficient to describe one embodiment of the present invention; other embodiments of the invention may use steps different from those shown in flowchart 300.

Referring to FIG. 3, at step 302 the invention's process for fabricating a high resistivity resistor begins with deposition of a polycrystalline silicon layer. For example, a polycrystalline silicon layer can be deposited on a wafer using a low pressure chemical vapor deposition ("LPCVD") process. At step 304 the invention's process for fabricating a high resistivity resistor continues by forming a doping barrier above the portion of the polycrystalline silicon layer which is to form the resistor. For example, photoresist can be used to form a barrier to ion implantation doping, as known in the art. The photoresist can be patterned to protect the area which is to form the resistor, for example, the photoresist would cover polycrystalline silicon layer 202 of structure 200 to prevent doping of the resistor region of polycrystalline silicon layer 202. The photoresist can be opened above areas to be N+ implant doped, for example, the photoresist would expose gate polycrystalline silicon 226 of structure 200.

Continuing with FIG. 3, at step 306 processing of a wafer in accordance with one embodiment continues by performing N+ doping of a transistor gate in the polycrystalline silicon layer. For example, gate polycrystalline silicon 226 can be ion implant doped through an opening in the photoresist doping barrier with phosphorous at a dose of approximately $6.5*10^{15}$ atoms per square centimeter.

At step 308, the invention's process for fabricating a high resistivity resistor continues by "blanket" doping the polycrystalline silicon layer after removal of the doping barrier. That is, the entire polycrystalline silicon layer is doped without using a second doping barrier to protect the transistor gate. For example, the doping barrier photoresist can be stripped followed by ion implant doping the entire polycrystalline silicon layer, including polycrystalline silicon layer 202 and gate polycrystalline silicon 226, using boron at a dose of approximately $1*10^{15}$ atoms per square centimeter. As described above, the extra dose of N+ dopant compensates for the P doping of gate polycrystalline silicon 226, leaving the performance of the PFET unaffected.

At step 310, the invention's process for fabricating a high resistivity resistor is followed with the formation of resistor contact regions. As described above, a silicide blocking oxide layer is first formed above the resistor material. For example, silicon oxide layer 206 may be formed, as known in the art, above polycrystalline silicon layer 202. The electrical connectivity of the contact regions may be enhanced by P+ doping the exposed regions of polycrystalline silicon layer 202 not covered by silicon oxide layer 206, as described above. Finally, contact regions are formed on the polycrystalline silicon layer comprising the resistor. For example, silicide can be formed on the silicon surface of polycrystalline silicon layer 202 by alloying of refractory metal to form silicide contact regions 204. Thus, flowchart 300 of FIG. 3 describes steps for economically forming a high resistivity resistor according to one embodiment of the present invention.

It is appreciated by the above detailed description that the invention provides a method for low cost fabrication of high resistivity resistors. The method reduces expense and complexity by using a process requiring only one implant barrier masking step to form the implant doped portion of a high value resistor. Using the invention, a high ohm value resistor can be formed economically in a CMOS, BiCMOS, or silicon-germanium BiCMOS process. Further, using the invention, temperature coefficient and accuracy of resistance can be improved. Although the invention is described as applied to a CMOS process, it will be readily apparent to a person of ordinary skill in the art how to apply the invention in similar situations where economical and simplified formation of high ohm value resistances are needed.

From the above description of the invention it is manifest that various techniques can be used for implementing the concepts of the present invention without departing from its scope. For example, although the particular embodiment of the present invention described here is applied to a CMOS process, the invention is also applicable, for example, to silicon or silicon-germanium bipolar or BiCMOS processes. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a method for low cost fabrication of high resistivity resistors has been described.

The invention claimed is:

1. A method comprising steps of:
    forming a layer over a transistor gate region and a field oxide region, said transistor gate region being situated over a well and said field oxide region not being situated over said well, wherein said field oxide region and said well are situated in a substrate;
    forming a doping barrier above said layer over said field oxide region after said step of forming said layer;
    doping said layer over said transistor gate region with a first dose of a first dopant after said step of forming said doping barrier, wherein said dose of said first dopant is a dosage greater than required to result in said layer over said transistor gate region having transistor gate electrical properties, wherein said first dopant has a first conductivity type;
    removing said doping barrier after said step of doping said layer over said transistor gate region with said first dose of said first dopant;
    doping said layer over said transistor gate region and said field oxide region with a second dose of a second dopant so as to form a high resistivity resistor in said layer over said field oxide region after said step of removing said doping barrier, wherein said second dopant has a second conductivity type, wherein said first dose of said first dopant is higher than said second dose of said second dopant such that said transistor gate electrical properties are unaffected by said second dose of said second dopant;
    forming a silicide blocking oxide layer over an inner portion of said layer over said field oxide region after said step of doping said layer over said transistor gate region and said field oxide region with said second dose of said second dopant;
    doping an outer portion of said layer over said field oxide region with a third dopant so as to form a high-doped region in said outer portion of said layer over said field oxide region after said step of forming said silicide blocking oxide layer over said inner portion of said layer over said field oxide region, wherein said third dopant has said second conductivity type;
    fabricating a contact region for said high resistivity resistor over said high-doped region in said outer portion of said layer over said field oxide region after said step of doping an outer portion of said layer over said field oxide region, wherein said contact region comprises a silicide.

2. The method of claim 1 wherein said layer comprises polycrystalline silicon.

3. The method of claim 1 wherein said transistor gate region is a gate of an PFET.

4. The method of claim 1 wherein said transistor gate region is a gate of an NFET.

5. The method of claim 1 wherein said field oxide comprises silicon dioxide.

6. The method of claim 1 wherein said first dopant is an N type dopant.

7. The method of claim 6 wherein said N type dopant comprises phosphorous.

8. The method of claim 1 wherein said first dopant comprises phosphorous at a dose of approximately $6.5 \times 10^{15}$ atoms per square centimeter.

9. The method of claim 1 wherein said second dopant is a P type dopant.

10. The method of claim 9 wherein said P type dopant comprises boron.

11. The method of claim 1 wherein said second dopant comprises boron at a dose of approximately $1.0 \times 10^{15}$ atoms per square centimeter.

* * * * *